(12) United States Patent
Yi et al.

(10) Patent No.: US 11,634,808 B2
(45) Date of Patent: Apr. 25, 2023

(54) ANTI-CORROSION CONDUCTIVE FILM AND PULSE BIAS ALTERNATION-BASED MAGNETRON SPUTTERING DEPOSITION METHOD AND APPLICATION THEREOF

(71) Applicant: Shanghai Jiaotong University, Shanghai (CN)

(72) Inventors: Peiyun Yi, Shanghai (CN); Weixin Zhang, Shanghai (CN); Linfa Peng, Shanghai (CN); Xinmin Lai, Shanghai (CN)

(73) Assignee: SHANGHAI JIAOTONG UNIVERSITY, Shanghai (CN)

( * ) Notice: Subject to any disclaimer, the term of this patent is extended or adjusted under 35 U.S.C. 154(b) by 0 days.

(21) Appl. No.: 16/964,113

(22) PCT Filed: Jan. 21, 2019

(86) PCT No.: PCT/CN2019/072479
§ 371 (c)(1),
(2) Date: Jul. 22, 2020

(87) PCT Pub. No.: WO2019/144853
PCT Pub. Date: Aug. 1, 2019

(65) Prior Publication Data
US 2021/0032740 A1 Feb. 4, 2021

(30) Foreign Application Priority Data
Jan. 24, 2018 (CN) .......................... 201810069493.2

(51) Int. Cl.
*C23C 14/34* (2006.01)
*C23C 14/02* (2006.01)
(Continued)

(52) U.S. Cl.
CPC .......... *C23C 14/345* (2013.01); *C23C 14/022* (2013.01); *C23C 14/025* (2013.01);
(Continued)

(58) Field of Classification Search
CPC ... C23C 14/345; C23C 14/022; C23C 14/025; C23C 14/0605; C23C 14/0635;
(Continued)

(56) References Cited

U.S. PATENT DOCUMENTS 5,997,698 A * 12/1999 Mino ................. C23C 14/0036
204/192.12
2001/0053459 A1 12/2001 Eerden et al.
(Continued)

FOREIGN PATENT DOCUMENTS

CN 101188149 A 5/2008
CN 101609729 A 12/2009
(Continued)

OTHER PUBLICATIONS

Fengji Li, et al. Multilayer DLC coatings via alternating bias during magnetron sputtering, 2011, Thin Solid Films, 519, p. 4910-4916 (Year: 2011).*
(Continued)

*Primary Examiner* — Jennifer Wecker
*Assistant Examiner* — Patrick S Ott
(74) *Attorney, Agent, or Firm* — Hamre, Schumann, Mueller & Larson, P.C.

(57) ABSTRACT

The disclosure provides an anti-corrosion conductive film and methods of making and using thereof. The anti-corrosion conductive film is formed by sequentially forming an anti-corrosion protective layer, a stress transition layer and a conducting layer on the surface of a substrate by deposition through a high-low pulse bias alternation method. The anti-corrosion conductive film is a nano-multilayer anti-
(Continued)

corrosion conductive film exhibiting excellent corrosion resistance and conductivity. The anti-corrosion conductive film has great application prospects in the fields of metal polar plates of fuel cells, ground grid equipment of power transmission lines, and the like.

7 Claims, 4 Drawing Sheets

(51) Int. Cl.
        *C23C 14/06*      (2006.01)
        *C23C 14/35*      (2006.01)
        *H01M 8/0208*    (2016.01)
        *H01M 8/0213*    (2016.01)
        *H01M 8/0228*    (2016.01)
        *H05K 9/00*        (2006.01)

(52) U.S. Cl.
        CPC ...... *C23C 14/0605* (2013.01); *C23C 14/0635* (2013.01); *C23C 14/35* (2013.01); *H01M 8/0208* (2013.01); *H01M 8/0213* (2013.01); *H01M 8/0228* (2013.01); *H05K 9/0098* (2013.01)

(58) Field of Classification Search
        CPC ... C23C 14/35; C23C 14/352; C23C 14/3464; C23C 14/3492; H01M 8/0208; H01M 8/0213; H01M 8/0228; H01M 8/0215; H01M 8/021; H01M 8/0206; H05K 9/0098; Y02E 60/50; H01R 13/03
        See application file for complete search history.

(56) References Cited

U.S. PATENT DOCUMENTS

| | | | | |
|---|---|---|---|---|
| 2002/0136895 | A1* | 9/2002 | Kohara | C23C 14/0605 428/408 |
| 2011/0067996 | A1* | 3/2011 | Strand | C23C 14/345 204/192.15 |
| 2013/0260057 | A1* | 10/2013 | Wu | C23C 14/345 427/569 |
| 2014/0356764 | A1* | 12/2014 | Iseki | C01B 32/05 429/518 |
| 2015/0348773 | A1* | 12/2015 | Zhu | H01J 37/3467 438/503 |
| 2016/0177434 | A1* | 6/2016 | Twigg | C23C 14/345 204/192.15 |
| 2017/0002454 | A1* | 1/2017 | Ozaki | C23C 14/0605 |

FOREIGN PATENT DOCUMENTS

| | | | |
|---|---|---|---|
| CN | 101710620 A | | 5/2010 |
| CN | 102560396 A | * | 7/2012 |
| CN | 102560396 A | | 7/2012 |
| CN | 102800871 A | | 11/2012 |
| CN | 102931421 A | | 2/2013 |
| CN | 103199279 A | | 7/2013 |
| CN | 108390075 A | | 8/2018 |

OTHER PUBLICATIONS

CN-102560396-A Translation (Year: 2012).*
Li, Fengji, et al., Multilayer DLC coatings via alternating bias during magnetron sputtering, Jan. 13, 2011, Thin Solid Films, 519, p. 4910-4916 (Year: 2011).*
Dai, Wei, et al., Effect of bias voltage on growth property of Cr-DLC film prepared by linear ion beam deposition technique, 2010, Vacuum, 85, p. 231-235 (Year: 2010).*
Kim, Wang Ryeol, et al., Effect of voltage on diamond-like carbon thin film using linear ion source, Jul. 29, 2012, Surface & Coatings Technology, 243, p. 15-19 (Year: 2012).*
International Search Report (in Chinese and English) and Written Opinion published in PCT/CN2019/072479, dated Mar. 29, 2019.
Li et al., "Multilayer DLC coatings via alternating bias during magnetron sputtering", Thin Solid Films, vol. 519, Issue 15, May 31, 2011, pp. 4910-4916, cited in ISR.
Wang et al., "Ti/(Ti,Cr)N/CrN multilayer coated 316L stainless steel by arc ion plating as bipolar plates for proton exchange membrane fuel cells", Journal of Energy Chemistry, vol. 26, Issue 1, Jan. 2017, pp. 168-174, cited in Specification.

* cited by examiner (a)

(b)

ANTI-CORROSION CONDUCTIVE FILM AND PULSE BIAS ALTERNATION-BASED MAGNETRON SPUTTERING DEPOSITION METHOD AND APPLICATION THEREOF

BACKGROUND OF THE INVENTION

1. Technical Field

The invention belongs to the technical field of fuel cells, and relates to an anti-corrosion conductive film and a pulse bias alternation-based magnetron sputtering deposition method and application thereof.

2. Description of Related Art

Fuel cells, as clean and efficient energy-conversion devices for direct conversion of chemical energy into electric energy, have received attention in more and more fields such as new energy automobiles, unmanned aerial vehicles, stationary power stations and micro-cells due to their eco-friendly qualities, high energy conversion efficiency and high energy density.

Metal polar plates, as one of the important components of PEM fuel cells, are mostly made from stainless steel at present. To make fuel cells adapt to humid, acid and high-temperature working conditions, surface modification needs to be carried out on stainless steel metal polar plates to make sure that the metal polar plates have good corrosion resistance and conductivity. In general, an anti-corrosion conductive film with certain thickness, such as amorphous carbon film, is deposited on the surface of the metal polar plates through physical vapor deposition (PVD) and chemical vapor deposition (CVD). Magnetron-sputtering belongs to PVD.

However, film materials prepared through PVD have the defects of through holes, columnar structures and the like. These defects will result in mechanical wear and stripping, electrochemical spot corrosion, shedding, and other invalidities when the films are used. Therefore, it is necessary to overcome these defects such as columnar structures.

Chinese Invention Patent Application No. 201310116099.7 discloses "Doped Multilayer Gradient Coating". In this disclosure, a coating suitable for stainless steel metal polar plates of fuel cells is prepared by sequentially depositing a Cr transition layer, a doped CrN layer, a doped chromium-nitrogen-carbon transition layer and a doped graphite-like-carbon coating. However, this multilayer coating prepared by sequentially depositing multiple elements and doped with other metallic elements may result in galvanic corrosion.

In Chinese Invention Patent Application No. 200910231657.8, a nickel coating and a nickel-copper-phosphorus coating are plated on the surface of a substrate. In this disclosure, the coatings are also prepared by compounding multiple elements and thus may result in galvanic corrosion, and this preparation method may cause environmental pollution.

In Paper "Ti/(Ti,Cr)N/CrN multilayer coated 316L stainless steel by arc ion plating as bipolar plates for proton exchange membrane fuel cells", a Ti/(Ti,Cr)N/CrN multilayer coating is prepared on a 316L stainless steel substrate by ion plating, and the conductivity and corrosion resistance of this coating are evaluated. However, the endurance of fuel cell stacks is not tested in this article. In addition, the surface topography of the coating prepared through this method was significantly changed after the coating is polarized with a constant potential, which might be caused by excessive internal stress and galvanic corrosion.

In summary, while the aforementioned patents and papers have brought forward several preparation methods for anti-corrosion conductive films to improve the corrosion resistance and conductivity of the films, the multilayer coatings prepared through these preparation methods still have the defects of columnar structures, holes, galvanic corrosion, high internal stress and the like. Therefore, it is necessary to make an improvement to overcome the defects of the prior art.

BRIEF SUMMARY OF THE INVENTION

The objective of the invention is to overcome the defects of the prior art by providing an anti-corrosion conductive film and a pulse bias alternation-based magnetron sputtering deposition method and application thereof.

The objective of the invention is fulfilled through the following technical solution:

A pulse bias alternation-based magnetron sputtering deposition method for an anti-corrosion conductive film is characterized in that an anti-corrosion protective layer, a stress transition layer and a conducting layer are sequentially formed on the surface of a substrate by deposition through a high-low pulse bias alternation method.

Preferably, the high-low pulse bias alternation method includes multiple high-low bias alternations; each high-low bias alternation is implemented by applying a low pulse bias with a small absolute value to carry out deposition for a time $T_L$ and then applying a high pulse bias with a large absolute value to carry out deposition for a time $T_H$, and in the process of forming the stress transition layer by deposition, the absolute value of the high pulse bias is increased gradually.

Coatings prepared by deposition with different biases have different internal stresses on account of the difference in particle energy during deposition. If the high pulse bias value is not gradually increased, there will be a large discrepancy in physical parameters of different coatings, thus resulting in a severe stress mismatch and aggravating coating shedding. Therefore, in the process of forming the stress transition layer by deposition, the absolute value of the high pulse bias is increased gradually.

In the process of forming the anti-corrosion protective layer by deposition, the bias values of the low pulse bias and the high pulse bias in each high-low bias alternation are constant.

In the process of forming the stress transition layer by deposition, the bias value of the low pulse bias in each high-low bias alternation is constant, and the absolute value of the high pulse bias in each high-low bias alternation is increased gradually.

In the process of forming the conducting layer by deposition, the bias values of the low pulse bias and the high pulse bias in the multiple high-low bias alternations are constant.

Preferably, in the process of forming the anti-corrosion protective layer by deposition, the bias value of the low pulse bias is −30V~−200V, the bias value of the high pulse bias is −200V~−800V, the number of high-low bias alternations is 2-8, and the deposition time of the high pulse bias and the deposition time of the low pulse bias meets $T_H:T_L=1:1$-$1:7$.

Preferably, in the process of forming the stress transition layer by deposition, the bias value of the low pulse bias is −30~200V, the bias value of the high pulse bias is −200V~

800V, the number of high-low bias alternations is 2-10, and the deposition time of the high pulse bias and the deposition time of the low pulse bias meets $T_H: T_L=1:2\text{-}1:5$.

Preferably, in the process of forming the conducting layer by deposition, the bias value of the low pulse bias is −30~−200V, the bias value of the high pulse bias is −200V~−800V, the number of high-low bias alternations is 2-20, and the deposition time of the high pulse bias and the deposition time of the low pulse bias meets $T_H: T_L=1:1\text{-}1:6$.

Preferably, in the high-low pulse bias alternation process, the parameters including air pressure, linear ion source voltage, speed and bias supply frequency are adjusted to fit the high-low pulse bias alternations.

In the coating deposition process, all the parameters may have an influence on coating deposition in the aspects of internal stress, density and the like. Therefore, in high-low pulse bias alternations, a high air pressure, a high linear ion source voltage, a high speed and a high bias supply frequency are adopted to fit the high pulse bias, and a low air pressure, a low linear ion source voltage, a low speed and a low bias supply frequency are adopted to fit the low pulse bias.

Preferably, the anti-corrosion protective layer is prepared from a metallic element with high corrosion resistance or an oxide of the metallic element, wherein the metallic element with high corrosion resistance is at least one of Al, Ti, Nb, Ta, V, Ni and W, and the oxide of the metallic element is at least one of $TiO_2$, $Nb_2O_5$ and $ZrO_2$. The stress transition layer is prepared from a metallic compound consisting of a metallic element and an element X, wherein the metallic element is Al, Ti, Nb, Ta, V, Ni, W, or the like, and the element X is nitrogen, carbon or silicon. The conducting layer is prepared from a conductive metallic compound consisting of an amorphous carbon film or a metallic element and the element X, such as $Ti_xSi_yC$ and $Ti_xN$.

Further preferably, the anti-corrosion protective layer is prepared from a metallic element or an oxide of the metallic element, the stress transition layer is prepared from a metallic compound consisting of a metallic element and an element X, and the conducting layer is prepared from a metallic compound consisting of an amorphous carbon film or a metallic element and the element X, wherein the element X is nitrogen, carbon or silicon, and the metallic elements of the anti-corrosion protective layer, the stress transition layer and the conducting layer are identical.

Preferably, the anti-corrosion protective layer has a thickness of 10-300 nm, the stress transition layer has a thickness of 10-200 nm, and the conducting layer has a thickness of 10-400 nm.

Preferably, the pulse bias alternation-based magnetron sputtering deposition method further comprises a preparation step which includes cleaning and drying of a substrate material. Cleaning of the substrate material includes ultrasonic cleaning with absolute ethyl alcohol, acetone, deionized water and the like. Drying of the substrate material is performed as follows: the substrate material is placed in a drying box and is dried at an appropriate temperature until moisture is evaporated.

Preferably, before the anti-corrosion protective layer deposited, plasma bias-sputtering cleaning is carried out to improve the surface cleanliness and surface energy of a metal polar plate of a fuel cell, so that the film-substrate bonding force is further increased.

An anti-corrosion conductive film is prepared through the method mentioned above. The anti-corrosion conductive film is a nano-multilayer anti-corrosion conductive film, and an anti-corrosion protective layer with a compact micro-structure, a stress transition layer with a small internal stress, and a conducting layer with higher conductivity are formed through the high-low pulse bias alternation method.

With regard to an application of the anti-corrosion conductive film, the anti-corrosion conductive film is used to improve the corrosion resistance and conductivity of a substrate, and the substrate comprises a bipolar plate of a fuel cell (such as common stainless steel materials (316, 316L, 304, 2Cr13, and the like), titanium alloy materials, motor materials of methanol fuel cells, and the like), ground grid materials of power transmission lines, and or polymer materials (particularly polymer materials for certain special application environments).

Compared with the prior art, the invention has the following beneficial effects:

(1) According to the invention, the pulse bias is alternately changed in the sputtering process to change the ion energy in plasma in the deposition process, so that an alternate nano-multilayer film is obtained. The plasma generated by the high pulse bias of the method can further bombard the coating, and the high and low biases, the proportion of the deposition times, and the number of alternations are adjusted to control the nano-multilayer anti-corrosion conductive film to develop towards higher conductivity, so that the nano-multilayer anti-corrosion conductive film has a compact micro-structure, high conductivity and a small internal stress. Compared with a method not adopting bias alternations, the bias alternation strategy inhibits the growth of columnar structures of the nano-multilayer alternate coating structure, thus avoiding a corrosion channel and improving the corrosion resistance, and changes the micro-structure of the coating through bias modulation, thus improving the conductivity.

(2) Compared with a common multilayer element alternation method (an alternate coating prepared from different elements), the surface layer of the nano-multilayer anti-corrosion conductive film prepared through the pulse bias alternation-based magnetron sputtering technology is made from the same metallic element, so that galvanic corrosion is avoided; and the nano-multilayer anti-corrosion conductive film has better comprehensive performance such as the corrosion resistance and the conductivity.

DETAILED DESCRIPTION OF THE INVENTION

The invention is expounded below in combination with the accompanying drawings and specific embodiments.

Figure 1:
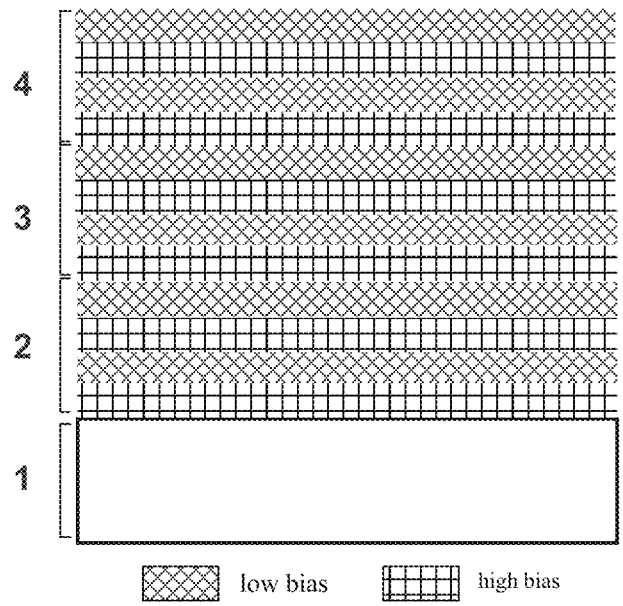
FIG. 1 is a sectional view of an anti-corrosion conductive film prepared through a pulse bias alternation-based magnetron sputtering deposition method, wherein 1 represents a substrate, 2 represents an anti-corrosion protective layer deposited by pulse bias alternation, 3 represents a stress transition layer deposited by pulse bias alternation, and 4 represents a conducting layer deposited by pulse bias alternation.

As shown in FIG. 1, an anti-corrosion conductive film is formed by sequentially forming an anti-corrosion protective layer, a stress transition layer and a conducting layer on the surface of a substrate by deposition through a high-low pulse bias alternation method. In FIG. 1, 1 represents the substrate, 2 represents the anti-corrosion protective layer deposited by pulse bias alternation, 3 represents the stress transition layer formed by pulse bias alternation, and 4 represents the conducting layer formed by pulse bias alternation.

Figure 3:
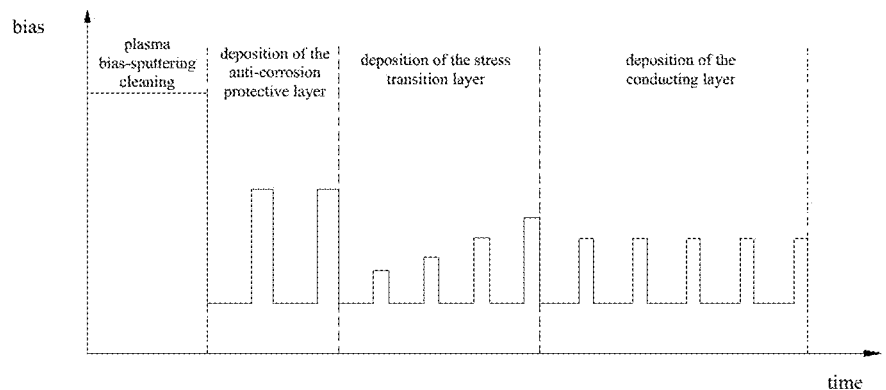
FIG. 3 is a bias curve chart in the process of preparing the nano-multilayer anti-corrosion conductive film through the pulse bias alternation-based magnetron sputtering deposition method.

Furthermore, the high-low pulse bias alternation method includes multiple high-low bias alternations; each high-low bias alternation is implemented by applying a low pulse bias with a small absolute value to carry out deposition for a time T$_L$ and then applying a high pulse bias with a large absolute value to carry out deposition for a time and in the process of forming the stress transition layer by deposition, the absolute value of the high pulse bias is increased gradually, as shown in FIG. 3.

Furthermore, in the process of forming the anti-corrosion protective layer by deposition, the bias values of the low pulse bias and the high pulse bias in each high-low pulse bias alternation are constant; in the process of forming the stress transition layer by deposition, the bias value of the low pulse bias in each high-low bias alternation is constant, and the absolute value of the high pulse bias in each high-low bias alternation is increased gradually; and in the process of forming the conducting layer by deposition, the bias values of the low pulse bias and the high pulse bias in the multiple high-low bias alternations are constant.

Particularly, the anti-corrosion conductive film is prepared through the following steps: preparation of a substrate material, plasma bias-sputtering cleaning, deposition of the anti-corrosion protective layer, deposition of the stress transition layer, deposition of the conducting layer, and cooling.

The substrate material includes materials involved in various fields such as common stainless steel materials (such as 316, 316L, 304 and 2Cr13) and titanium alloy materials for metal bipolar plates of fuel cells, electrode materials of methanol fuel cells, ground grid materials of power transmission lines, and polymer materials in special application environments.

The preparation of the substrate material includes cleaning and drying of the substrate material. Cleaning of the substrate materials includes ultrasonic cleaning with absolute ethyl alcohol, acetone, deionized water and the like. Drying of the substrate materials is performed as follows: the substrate material is placed in a drying box and is dried at an appropriate temperature until moisture is evaporated.

The anti-corrosion protective layer has a thickness of 10-300 nm and is prepared from a metallic element with high corrosion resistance or an oxide of the metallic element, wherein the metallic element with high corrosion resistance is at least one of Al, Ti, Nb, Ta, V, Ni and W, and the oxide of the metallic element is at least one of TiO$_2$, Nb$_2$O$_5$ and ZrO$_2$. The anti-corrosion protective layer obtained through the high-low pulse bias alternation method has a more compact micro-structure. Particularly, in the sputtering process, a low pulse bias with a small absolute value is applied to a rotating stand to carry out deposition for a time T$_{L1}$, and then a high pulse bias with a large absolute value is applied to the rotating stand to carry out deposition for a time T$_{H1}$. The low pulse bias with the deposition time of T$_{L1}$ and the high pulse bias with the deposition time of T$_{H1}$ constitute one alternation. According to the design of a magnetron sputtering system, the value of the high pulse bias is different from the value of the low pulse bias. Generally, an appropriate range of the value of the low pulse bias is −30V∼−200V, and an appropriate range of the value of the high pulse bias is −200V∼−800V. The number of high-low bias alternations is 2-5, and the ratio of T$_{H1}$ to T$_{L1}$ is 1:1-1:7.

The stress transition layer has a thickness of 10-200 nm, and is prepared from a metallic compound consisting of a metallic element and an element X, wherein the metallic element is Al, Ti, Nb, Ta, V, Ni, W, or the like, and the element X is nitrogen, carbon or silicon. The high-low pulse bias alternation method is adopted in the preparation process of the stress transition layer. The stress transition layer obtained through the high-low pulse bias alternation-based deposition method has a small internal stress. Particularly, in the sputtering process, a low pulse bias with a small absolute value is applied to the rotating stand to carry out deposition for a time T$_{L2}$, and then a high pulse bias with a large absolute value is applied to the rotating stand to carry out deposition for a time T$_{H2}$. The low pulse bias with the deposition time of 112 and the high pulse bias with the deposition time of T$_{H2}$ constitute one alternation. According to the design of the magnetron sputtering system, the value of the high pulse bias is different from the value of the low pulse bias. Generally, an appropriate range of the value of the low pulse bias is −30V∼−200V, and the value of the high pulse bias is gradually increased with the increase of alternations and ranges from −200V to −800V. The number of bias alternations is 2-10, and the ratio of T$_{H2}$ to T$_{L2}$ is 1:2-1:5.

The conducting layer has a thickness of 10-400 nm and is prepared from a conductive metallic compound consisting of an amorphous carbon film or a metallic element and the element X, such as Ti$_x$Si$_y$C and Ti$_x$N. The high-low pulse bias alternation method is adopted in the preparation process of the conducting layer. The conducting layer obtained through the high-low pulse bias alternation-based deposition method can be controlled to develop towards higher conductivity, so that the conductivity of the conducting layer is improved. Particularly, in the sputtering process, a low pulse bias with a small absolute value is applied to the rotating stand to carry out deposition for a time T$_{L3}$, and then a high pulse bias with a large absolute value is applied to the rotating stand to carry out deposition for a time T$_{H3}$. The low pulse bias with the deposition time of T$_{L3}$ and the high pulse bias with the deposition time of T$_{H3}$ constitute one alternation. According to the design of the magnetron sputtering system, the value of the high pulse bias is different from the value of the low pulse bias. Generally, an appropriate range of the value of the low pulse bias is −30V∼−200V, and an appropriate range of the value of the high pulse bias is −200V~−800V. The number of bias alternations is 2-20, and the ratio of $T_{H3}$ to $T_{L3}$ is 1:1-1:6.

The high-low pulse bias alternation technology not only involves high-low pulse bias alternations, but also includes proper modification of the process parameters such as air pressure, linear ion source voltage, speed, pulse bias supply frequency to make sure that these process parameters fit the bias alternations to fulfill alternate deposition. In general, a high air pressure, a high linear ion source voltage, a high speed and a high bias supply frequency are adopted to fit the high pulse bias, and a low air pressure, a low linear ion source voltage, a low speed and a low bias supply frequency are adopted to fit the low pulse bias. According to the deposition strategy, plasma generated by the high pulse bias can further bombard the coating, the bombarding time of the high pulse bias, the number of alternations and the bombarding intensity are controlled to enhance the conductivity, and finally, a nano-multilayer anti-corrosion conductive film with a compact micro-structure, high conductivity and small internal stress is formed.

Specific embodiments are described below.

To facilitate the description, all bias values mentioned in the following embodiments should be interpreted as absolute bias values.

Embodiment 1

Figure 2:
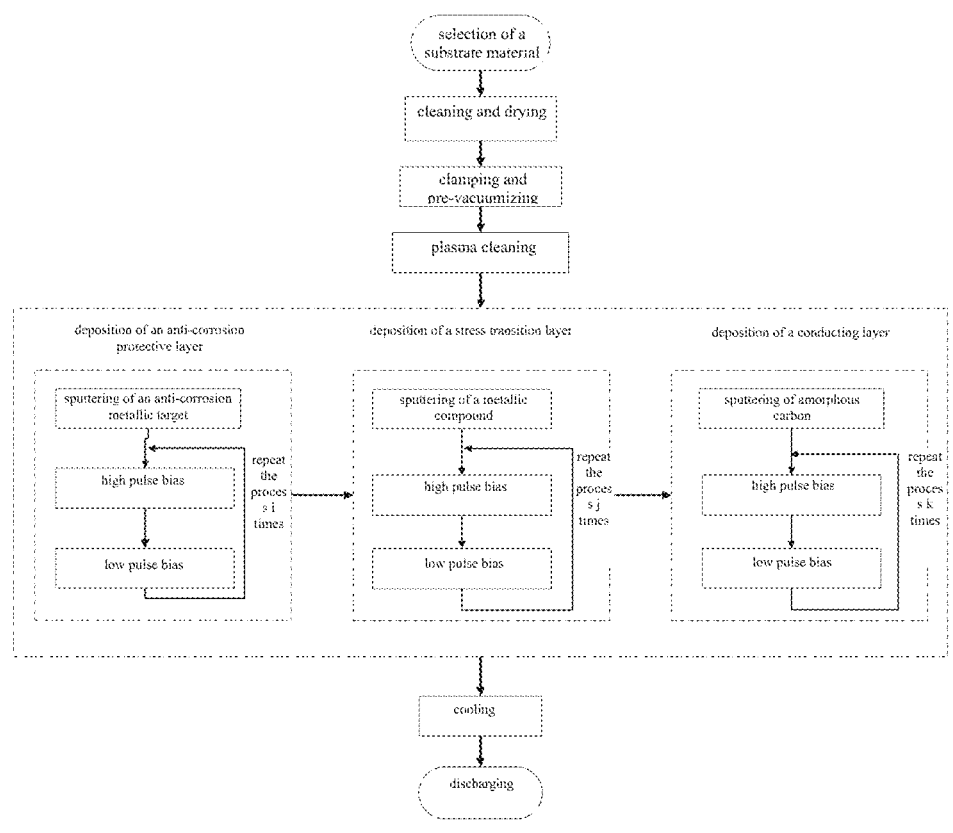
FIG. 2 is a schematic diagram of the process of preparing the anti-corrosion conductive film through the pulse bias alternation-based magnetron sputtering deposition method.

As shown in FIG. 2, the process of preparing a nano-multilayer anti-corrosion conductive film through a pulse bias alternation-based magnetron sputtering deposition method specifically comprises the following steps:

(1) Stainless steel 316L is used as a substrate material of a metal polar plate of a fuel cell and is punched and blanked to make sure that the metal polar plate of the fuel cell; the metal polar plate is ultrasonically cleaned sequentially with absolute ethyl alcohol, deionized water, acetone, deionized water and deionized water, and is then dried;

(2) The metal bipolar plate is clamped onto a rotating stand of a magnetron sputtering coating system and vacuumized until the background vacuum degree of a cavity is lower than $1*10^{-5}$ Pa;

(3) Plasma bias-sputtering cleaning is carried out: argon is injected at a flow rate of 100 sccm, the bias is set to 800V, the argon is ionized to obtain high-energy plasma, and a substrate of the metal bipolar plate of the fuel cell is bombarded by means of $Ar^+$ in the plasma, so that the surface cleanliness and surface energy of the metal bipolar plate of the fuel cell are further improved, and the film-substrate bonding force is further increased;

(4) An anti-corrosion protective layer is deposited: the flow rate of the argon is controlled to 50 sccm, the target current of Cr is controlled to 12A, and the linear ion source voltage is controlled to 1500V; then, a high-low pulse bias alternation is carried out for deposition, that is, a low pulse bias of 120V is applied for deposition for $T_{L1}$=5 min and then a high pulse bias of 400V is applied for deposition for $T_{H1}$=1 min to complete one alternation, and the alternation is carried out 5 times in this way, so that the anti-corrosion protective layer is finally formed;

(5) A stress transition layer is deposited: the flow rate of the argon is controlled to 40 sccm, the target current of Cr is controlled to 8A, the target current of C is controlled to 5A, the linear ion source voltage is controlled to 1300V, and then a high-low pulse bias alternation is carried out for deposition, that is, a low pulse bias of 150V is applied for deposition for $T_{L2}$=3 min and then a high pulse bias of 200V is applied for deposition for $T_{H2}$=1 min to complete one alternation, and the alternation is carried out 3 times in such as manner that the low pulse bias is kept unchanged and the high pulse bias is gradually increased by 100V every time, so that the stress transition layer is finally formed;

(6) A conducting layer is deposited: the flow rate of the argon is controlled to 70 sccm, the target current of C is controlled to 5A, the linear ion source voltage is controlled to 1300V, and then a high-low pulse bias alternation is carried out for deposition, that is, a low pulse bias of 100V is applied for deposition for $T_{L3}$=6 min and then a high pulse bias of 450V is applied for deposition for $T_{H3}$=2 min to complete one alternation, and the alternation is carried out 20 times, so that the conducting layer is finally formed; and (7) Vacuum cooling, discharging and unloading are carried out.

Embodiment 2

As shown in FIG. 2, the process of preparing a nano-multilayer anti-corrosion conductive film through a pulse bias alternation-based magnetron sputtering deposition method specifically comprises the following steps:

(1) Stainless steel 316L is used as a substrate material of a metal polar plate of a fuel cell and is punched and blanked to make sure that the metal bipolar plate of the fuel cell has a flow field; the metal polar plate is ultrasonically cleaned sequentially with absolute ethyl alcohol, deionized water, acetone, deionized water and deionized water, and is then dried;

(2) The metal bipolar plate is clamped onto a rotating stand of a magnetron sputtering coating system, and vacuumizing is carried out to make the background vacuum degree of a cavity lower than $1*10^{-5}$ Pa;

(3) Plasma bias-sputtering cleaning is carried out: argon is injected at a flow rate of 100 sccm, the bias is set to 800V, the argon is ionized to obtain high-energy plasma, and a substrate of the metal bipolar substrate of the fuel cell is bombarded by means of $Ar^+$ in the plasma, so that the surface cleanliness and surface energy of the metal bipolar plate of the fuel cell are further improved, and the film-substrate bonding force is further increased;

(4) An anti-corrosion protective layer is deposited: the flow rate of the argon is controlled to 50 sccm, the target current of Ti is controlled to 12A, and the linear ion source voltage is controlled to 1500V; then, a high-low pulse bias alternation is carried out for deposition, that is, a low pulse bias of 120V is applied for deposition for $T_{L1}$=5 min and then a high pulse bias of 400V is applied for deposition for $T_{H1}$=1 min to complete one alternation, and the alternation is carried out 5 times in this way, so that the anti-corrosion protective layer is finally formed;

(5) A stress transition layer is deposited: the flow rate of the argon is controlled to 40 sccm, the target current of Ti is controlled to 8 A, the target current of C is controlled to 5 A, the linear ion source voltage is controlled to 1300V, and then a high-low pulse bias alternation is carried out for deposition, that is, a low pulse bias of 150V is applied for deposition for $T_{L2}$=3 min and then a high pulse bias of 200V is applied for deposition for $T_{H2}$=1 min to complete one alternation, and the alternation is carried out 3 times in such as manner that the low pulse bias is kept unchanged and the high pulse bias is gradually increased by 100V every time, so that the stress transition layer is finally formed;

(6) A conducting layer is deposited: the flow rate of the argon is controlled to 70 sccm, and the target current of C is controlled to 5A, and then a high-low pulse bias alternation is carried out for deposition, that is, a low pulse bias of 100V is applied for deposition for $T_{L3}$=6 min under the condition where the linear ion source voltage is controlled to 800V and then a high pulse bias of 450V is applied for deposition for $T_{H3}$=2 min under the condition where the linear ion source voltage is controlled to 1600V to complete one alternation, and the alternation is carried out 20 times, so that the conducting layer is finally formed; and (7) Vacuum cooling, discharging and unloading are carried out.

Comparative Embodiment 1

In this comparative embodiment, an anti-corrosion conductive film is prepared without bias alternations, low bias parameters in the high-low pulse bias alternation strategy in Embodiment 2 are used as bias parameters in this comparative embodiment, and the total deposition time in this comparative embodiment is the same as that in Embodiment 2.

Figure 4:
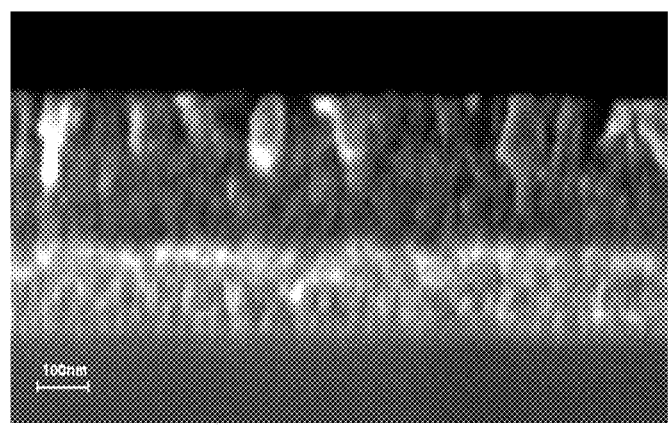
FIG. 4 shows a cross-sectional SEM picture of a TiCx/a-C film prepared without bias alternations (a) and a cross-sectional SEM picture of a TiCx/a-C film prepared through a high-low pulse bias alternation technology (b)
Figure 4:
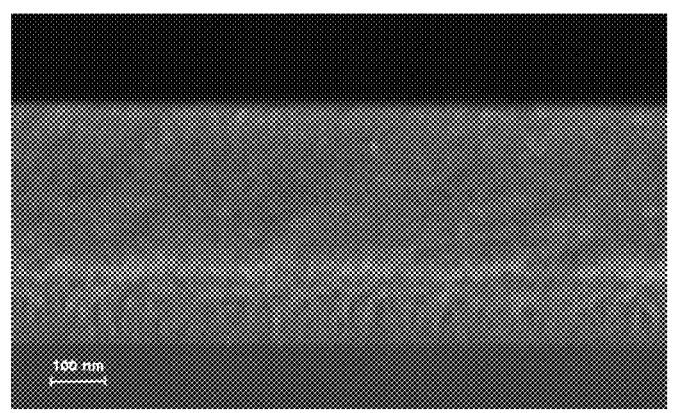

FIG. 4 shows a cross-sectional SEM picture of a TiCx/a-C film prepared without bias alternations (a) and a cross-sectional SEM picture of a TiCx/a-C film prepared through the high-low pulse bias alternation technology (b). As can be seen from FIG. 4, the cross section of the coating prepared through the high-low pulse bias alternation method is more compact, and a corrosion channel formed by columnar structures is avoided.

Figure 5:
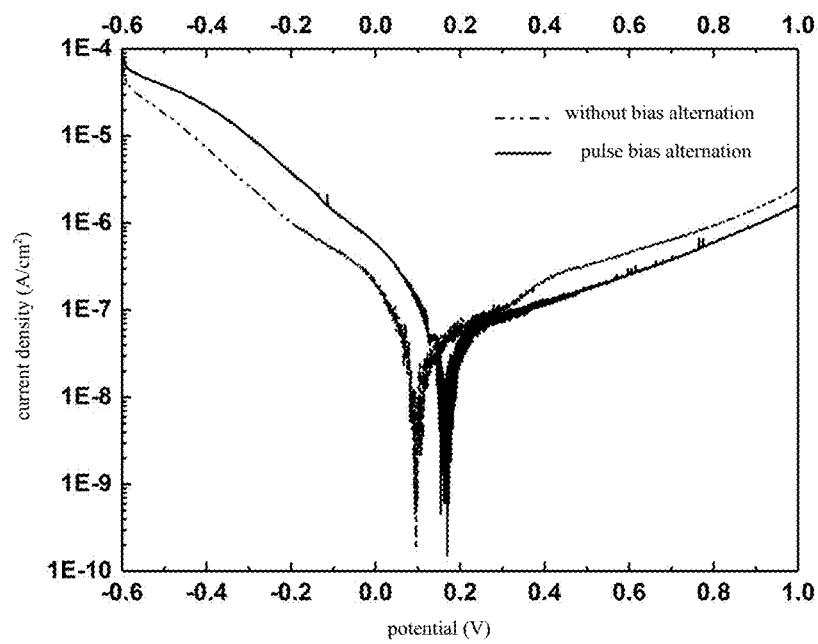
FIG. 5 shows potentiodynamic polarization curves of the TiCx/a-C film prepared without bias alternations and the TiCx/a-C film prepared through the high-low pulse bias alternation technology (electrochemical corrosion condition of 80° C., pH=3 H$_2$SO$_4$, and 1 ppm HF)

FIG. 5 shows potentiodynamic polarization curves of the TiCx/a-C film prepared without bias alternations (in Comparative Embodiment 1) and the TiCx/a-C film prepared through the high-low pulse bias alternation technology (in Embodiment 2 (electrochemical corrosion condition of 80° C., pH=3 $H_2SO_4$, and 1 ppm HF). As can be seen from FIG. 5, after the coating prepared through the high-low pulse bias alternation method is subjected to potentiodynamic polarization, the self-corrosion potential is increased, and the corrosion current density is reduced, which indicates that the corrosion resistance of the coating is improved.

Figure 6:
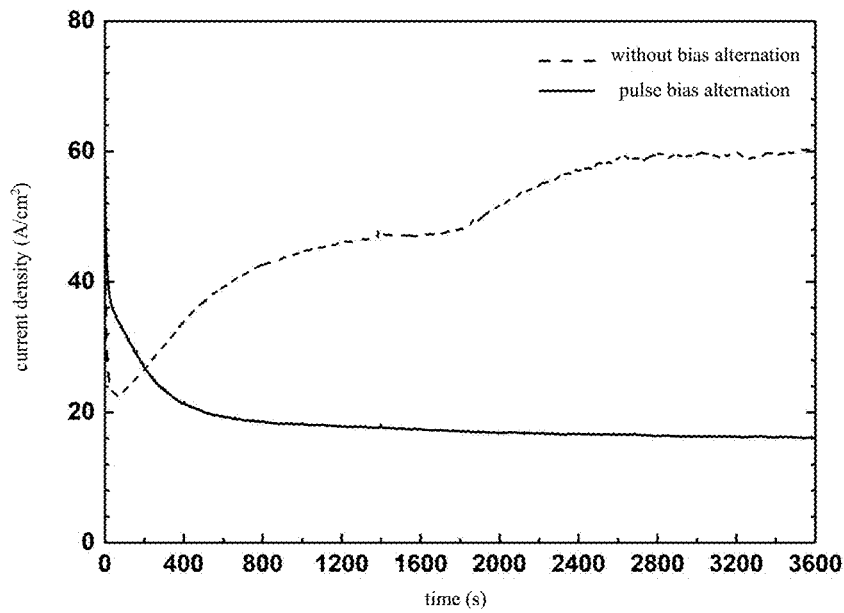
FIG. 6 shows potentiodynamic polarization curves of the TiCx/a-C film prepared without bias alternations and the TiCx/a-C film prepared through the high-low pulse bias alternation technology (1.6V vs SHE, 1 h, electrochemical corrosion condition of 80° C., pH=3 H$_2$SO$_4$, and 1 ppm HF)

FIG. 6 shows potentiodynamic polarization curves of the TiCx/a-C film prepared without bias alternations (in Comparative Embodiment 1) and the TiCx/a-C film prepared through the high-low pulse bias alternation technology (in Embodiment 2) (1.6V vs SHE, 1 h, electrochemical corrosion condition of 80° C., pH=3 $H_2SO_4$, and 1 ppm HF). As can be seen from the potentiodynamic polarization result in FIG. 6, the coating prepared through the high-low pulse bias alternation method has a lower corrosion current density, which indicates that the coating still has good corrosion resistance under a high-potential corrosion condition.

Figure 7:
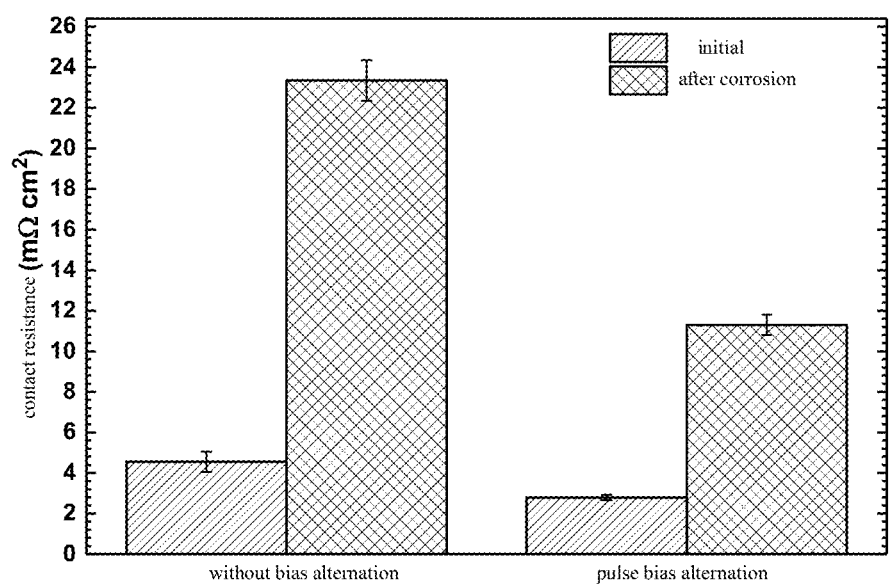
FIG. 7 shows the contact resistance of the TiCx/a-C film prepared without bias alternations (a) and the TiCx/a-C film prepared through the high-low pulse bias alternation technology (b) before and after corrosion.

FIG. 7 shows the contact resistance of the TiCx/a-C film prepared without bias alternations (a) and the TiCx/a-C film prepared through the high-low pulse bias alternation technology (b) before and after corrosion. As can be seen from FIG. 7, the contact resistance between the coating prepared through the high-low pulse bias alternation method and carbon paper is reduced, which indicates that this deposition method can improve the surface conductivity of the coating.

Embodiment 3

As shown in FIG. 2, the process of preparing a nano-multilayer anti-corrosion conductive film through a pulse bias alternation-based magnetron sputtering deposition method specifically comprises the following steps:

(1) A red copper grid is used as a substrate material of a device used for military communication shielding, is ultrasonically cleaned sequentially with absolute ethyl alcohol, deionized water, acetone, deionized water and deionized water, and is then dried;

(2) The red copper grid is clamped onto a rotating stand of a magnetron sputtering coating system, and vacuumizing is carried out to make the background vacuum degree of a cavity lower than $1*10^{-5}$ Pa;

(3) Plasma bias-sputtering cleaning is carried out: argon is injected at a flow rate of 100 sccm, the bias is set to 800V, the argon is ionized to obtain high-energy plasma, and a substrate of the red copper grid is bombarded by means of $Ar^+$ in the plasma, so that the surface cleanliness and surface energy of the red copper grid are further improved, and the film-substrate bonding force is further increased;

(4) An anti-corrosion protective layer is deposited: the flow rate of the argon is controlled to 50 sccm, the target current of Cr is controlled to 12A, and the linear ion source voltage is controlled to 1500V; then, a high-low pulse bias alternation is carried out for deposition, that is, a low pulse bias of 120V is applied for deposition for $T_{L1}$=5 min and then a high pulse bias of 400V is applied for deposition for $T_{H1}$=1 min to complete one alternation, and the alternation is carried out 3 times in this way, so that the anti-corrosion protective layer is finally formed;

(5) A stress transition layer is deposited: the flow rate of the argon is controlled to 40 sccm, the target current of Cr is controlled to 8A, the target current of C is controlled to 5A, the linear ion source voltage is controlled to 1300V, and then a high-low pulse bias alternation is carried out for deposition, that is, a low pulse bias of 120V is applied for deposition for $T_{L2}$=3 min and then a high pulse bias of 200V is applied for deposition for $T_{H2}$=1 min to complete one alternation, and the alternation is carried out twice in such as manner that the low pulse bias is kept unchanged and the high pulse bias is gradually increased by 150V every time, so that the stress transition layer is finally formed;

(6) A conducting layer is deposited: the flow rate of the argon is controlled to 60 sccm, the target current of C is controlled to 5A, the linear ion source voltage is controlled to 1300V, and then high-low pulse bias alternation is carried out for deposition, that is, a low pulse bias of 100V is applied for deposition for $T_{L3}$=4 min and then a high pulse bias of 450V is applied for deposition for $T_{H3}$=1 min to complete one alternation, and the alternation is carried out 12 times, so that the conducting layer is finally formed; and (7) Vacuum cooling, discharging and unloading are carried out.

Those ordinarily skilled in the art can appreciate and use the invention by referring to the description of the above embodiments. Clearly, any skilled in the art can easily make various modifications to the above embodiments and can apply the general principle of the invention to other embodiments without creative labor. Therefore, the invention is not limited to the above embodiments, and all improvements and modifications made by those skilled in the art according to the disclosure of the invention without deviating from the scope of the invention should fall within the protection scope of the invention.

What is claimed is:
1. A pulse bias alternation-based magnetron sputtering deposition method for making an anti-corrosion conductive film, comprising
   sequentially forming an anti-corrosion protective layer, a stress transition layer, and a conducting layer on a surface of a substrate by deposition through a high-low pulse bias alternation method;

inhibiting columnar structures growth to reduce contact resistance in the anti-corrosion conductive film by the high-low pulse bias alternation method, wherein the high-low pulse bias alternation method comprises multiple high-low bias alternations;

the anti-corrosion conductive film comprises carbon, each of the multiple high-low bias alternations follows a step function and is implemented by applying a low pulse bias, the low pulse bias to carry out deposition for a deposition time $T_L$ at a low bias supply frequency, and then applying a high pulse bias, the high pulse bias to carry out deposition for a deposition time $T_H$ at a high bias supply frequency, the high pulse bias has an absolute value larger than that of the low pulse bias, in the process of forming the stress transition layer by deposition, the absolute value of the high pulse bias is increased gradually from one high-low bias alternation to another, and in the process of forming the stress transition layer by deposition, a bias value of the low pulse bias is −30V to −200V, a bias value of the high pulse bias is −200V to −800V, the number of the high-low bias alternations is 2-10, and the deposition time of the high pulse bias and the deposition time of the low pulse bias meets $T_H$: $T_L$=1:2-1:5.

2. The pulse bias alternation-based magnetron sputtering deposition method of an anti-corrosion conductive film according to claim 1, wherein:

in the process of forming the anti-corrosion protective layer by deposition, bias values of the low pulse bias and the high pulse bias in each of the multiple high-low bias alternations are constant;

in the process of forming the stress transition layer, the bias value of the low pulse bias in each of the multiple high-low bias alternations is constant, and the absolute value of the high pulse bias in each of the multiple high-low bias alternations is increased gradually; and in the process of forming the conducting layer by deposition, the bias values of the low pulse bias and the high pulse bias in the multiple high-low bias alternations are constant.

3. The pulse bias alternation-based magnetron sputtering deposition method of an anti-corrosion conductive film according to claim 1, wherein the high-low pulse bias alternation method is optimized by adjusting one or more parameters selected from a group consisting of operating pressure, rotational speed, and bias supply frequency of the high-low pulse bias alternations.

4. The pulse bias alternation-based magnetron sputtering deposition method of an anti-corrosion conductive film according to claim 1, wherein the anti-corrosion protective layer is prepared from a metallic element or an oxide of the metallic element, the stress transition layer is prepared from a metallic compound consisting of a metallic element and an element X, and the conducting layer is an amorphous carbon film or prepared from a metallic compound consisting of a metallic element and the element X, wherein the element X is nitrogen, carbon or silicon, and the metallic element of the anti-corrosion protective layer is identical to that of the stress transition layer and the conducting layer.

5. The pulse bias alternation-based magnetron sputtering deposition method of claim 1, wherein the high pulse bias, in the process of forming the stress transition layer by deposition, increases incrementally by 100V or 150V.

6. The pulse bias alternation-based magnetron sputtering deposition method of claim 1, wherein $T_L$ is 1 to 3, 4, 5, or 6 minutes.

7. The pulse bias alternation-based magnetron sputtering deposition method of claim 1, wherein $T_H$ is 1 to or 2 minutes.

* * * * *